United States Patent [19]

Levinson

[11] Patent Number: 5,247,532
[45] Date of Patent: Sep. 21, 1993

[54] METHOD AND APPARATUS FOR STIMULATING A LASER DIODE IN A FIBER OPTIC TRANSMITTER

[75] Inventor: Frank H. Levinson, Palo Alto, Calif.

[73] Assignee: Finisar Corporation, Menlo Park, Calif.

[21] Appl. No.: 891,730

[22] Filed: Jun. 1, 1992

[51] Int. Cl.$^5$ ............................................. H01S 33/00
[52] U.S. Cl. ...................................... 372/38; 372/31; 372/29; 372/26
[58] Field of Search ....................... 372/33, 38, 29, 32, 372/28, 31, 26

[56] References Cited

U.S. PATENT DOCUMENTS

| | | | |
|---|---|---|---|
| 4,357,713 | 11/1982 | Blackburn et al. | 455/609 |
| 4,677,632 | 6/1987 | Lisco et al. | 372/31 |
| 4,918,396 | 4/1990 | Halemane et al. | 372/31 |
| 5,019,769 | 5/1991 | Levinson | 372/31 |
| 5,146,464 | 9/1992 | Uemura | 372/38 |
| 5,153,765 | 10/1992 | Grunziger | 372/38 |

Primary Examiner—Georgia Y. Epps
Attorney, Agent, or Firm—Woodard, Emhardt, Naughton, Moriarty & McNett

[57] ABSTRACT

A fiber optic transmitter circuit includes a DC bias circuit that produces a DC voltage, an amplifier circuit having data signal inputs and that produces a data signal and wherein the data signal and the DC voltage are supplied to a laser diode to stimulate the diode to produce light of a corresponding nature. The amplifier is selected so that the inherent noise level or noise figure characteristics of the amplifier are such as to provide stimulation of a single mode laser diode in the frequency band wherein the resonant frequency of the laser diode is typically found. The resulting impact of the noise on the laser diode is to transform the single mode laser diode into a multi-mode laser diode thereby reducing the impact of modal noise on the fiber optic data transmission system that incorporates the disclosed fiber optic transmitter device.

12 Claims, 7 Drawing Sheets

METHOD AND APPARATUS FOR STIMULATING A LASER DIODE IN A FIBER OPTIC TRANSMITTER

FIELD OF THE INVENTION

This invention relates to fiber optic communication systems and more specifically to fiber optic transmitters incorporating laser diodes for transforming electrical data signals into optical data signals.

BACKGROUND OF THE INVENTION

Semiconductor laser diodes are well-known for their applications in fiber optic communications links. These devices have been used in systems for long distance fiber optic communications since the early 1980's. Laser diodes used in fiber optic communications applications have typically been expensive since sorting of the laser diodes is required to select those devices with desired performance characteristics. Further, packaging and special temperature maintaining circuits contribute to the expense associated with implementation of laser diodes.

Figure 1:
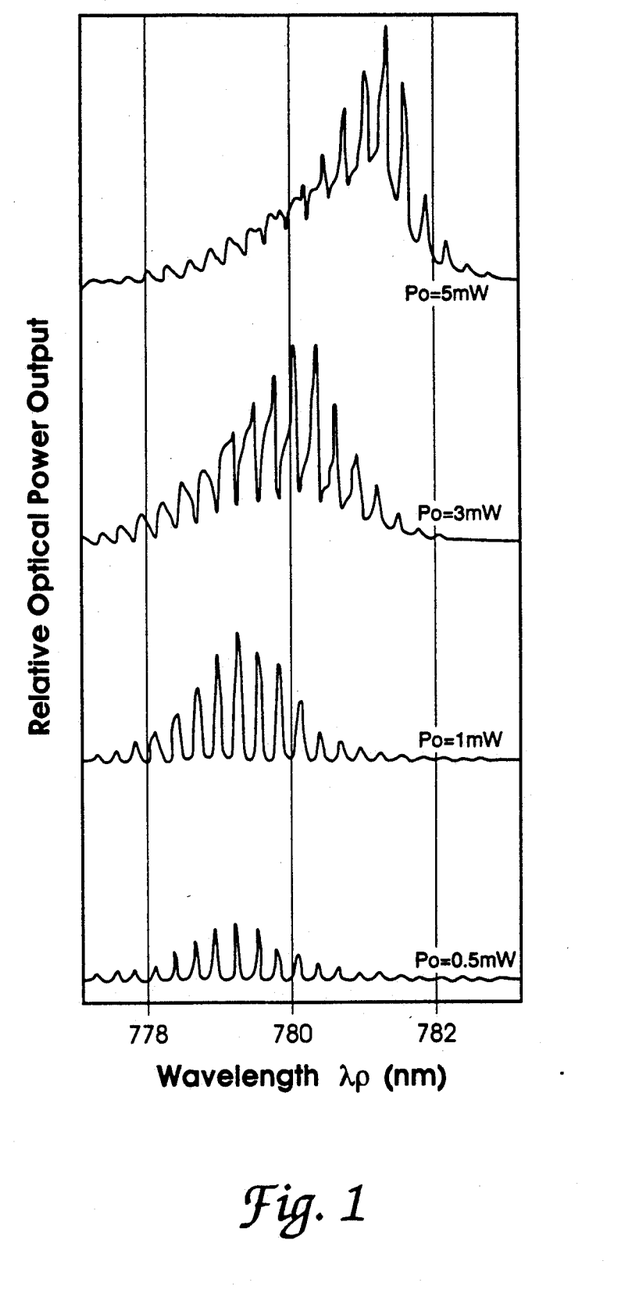
FIG. 1 is a chart including several curves describing the spectral response of a self-pulsating laser diode at various power levels.
Figure 2:
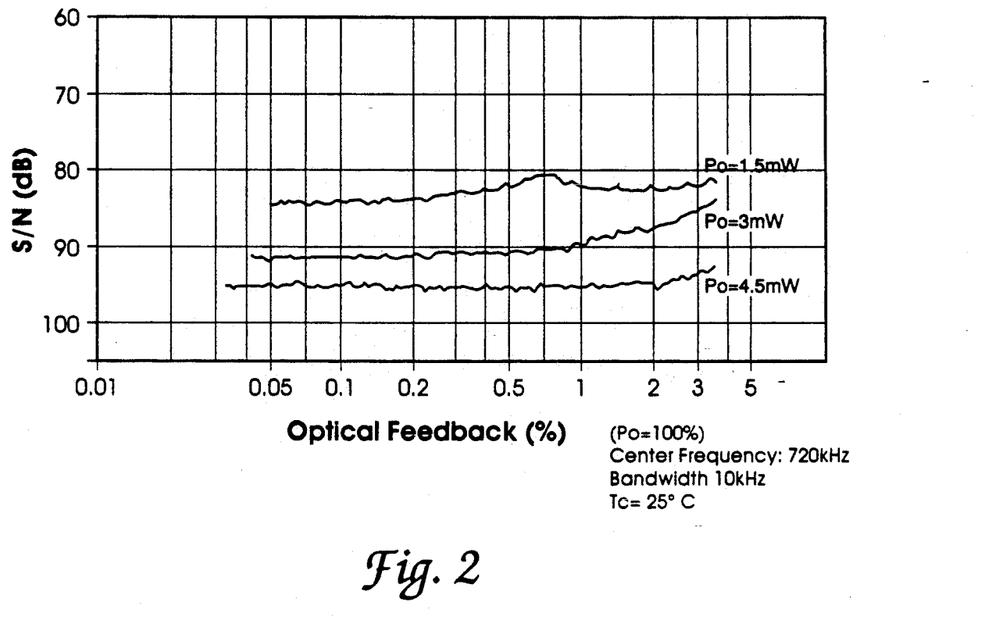
FIG. 2 is a chart including several curves describing the signal-to-noise characteristics of a self-pulsating laser diode at various power levels.

Subsequently, laser diodes were developed for use in audio electronics devices such as compact disc players. Laser diodes used in compact disc players are designed to be low cost and have simple packaging requirements as a component of the overall cost objective. Two types of laser diodes were developed for the compact disc player products. The first is a self-pulsating laser diode that has a rather broad spectrum consisting of many longitudinal modes or spectra. Examples of this device are the Sharp LT023, the Mitsubishi ML4014C, and the Sony SLD104AU. These devices were developed to have excellent signal-to-noise (S/N) characteristics even in the occurrence of strong back reflection of light from the application back into the laser cavity. A graph depicting a typical spectral response for the Sharp LT023 device is shown in FIG. 1 and a signal-to-noise curve for the device is shown in FIG. 2. Note that multiple graphs or curves are shown in FIG. 1, each illustrating the response of the device at a specific power output level, i.e. 0.5 milliwatts, 1.0 milliwatts, 3.0 milliwatts and 5.0 milliwatts.

Self-pulsating lasers tend to "ring" strongly with modulation. This characteristic must be filtered out by a fiber optic receiver in order to properly recover the modulated data signal. A self-pulsating laser has been specified in the most widely used low cost fiber optic data communications system standard known as "Fiber Channel". This standard was developed and written primarily by the IBM Corporation participating in the ANSI X3T9.3 Committee. The natural frequency of self-pulsating lasers is typically between 1 and 2 gigahertz (GHz). Thus, the requirement of the Fiber Channel specification that there be at least three self-pulsating periods in a bit cell means that at a bit rate of 266.0 megabits per second (Mb/s), a self-pulsating frequency of at least 1 GHz is desirable. The Fiber Channel specification defines the operating characteristics for fiber optic communications systems operating at 266, 531 and 1062 Mb/s. If self-pulsating lasers are used in the Fiber Channel system that their self-pulsating frequencies would have to be greater than 750 MHz, 1.5 GHz and 3.0 GHz, respectively. The latter two frequencies require selection for the 1.5 GHz specification and may not be possible for the 3.0 GHz frequency. Sorting and selection of laser diodes with these special properties and characteristics dramatically increases the cost of this critical component.

Figure 3:
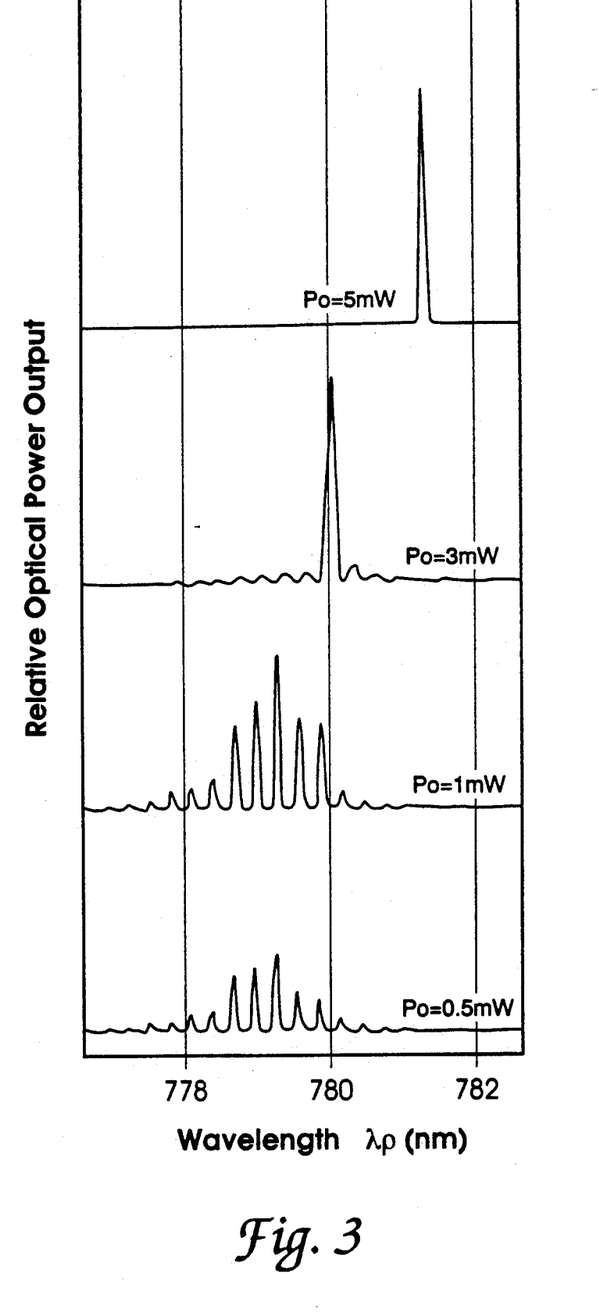
FIG. 3 is a chart including several curves describing the frequency response of a single longitudinal mode laser diode at various power levels.
Figure 4:
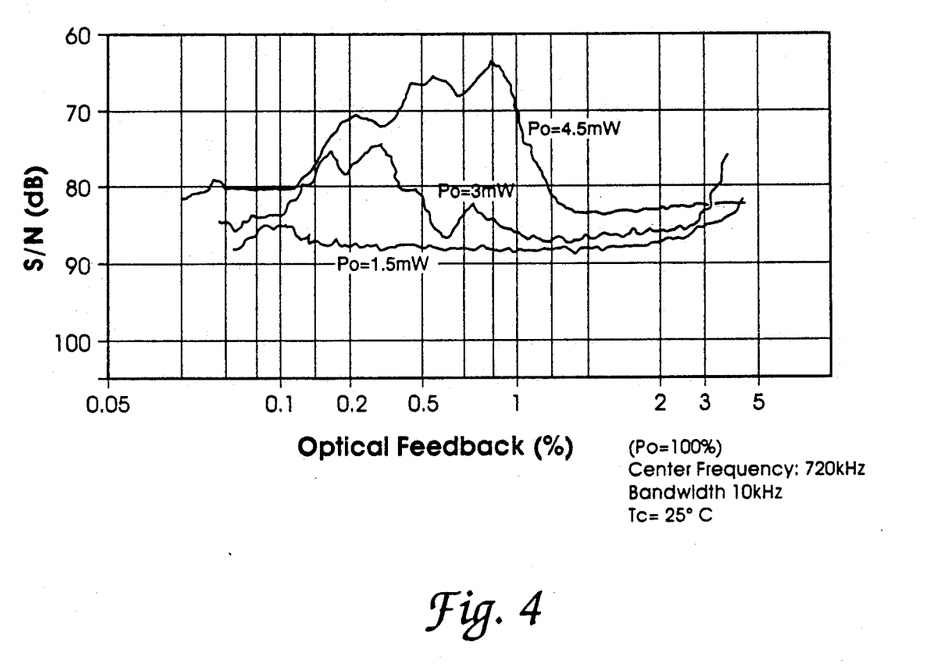
FIG. 4 is a chart including several curves describing the signal-to-noise characteristics of a single mode laser diode at various power levels.

A second type of laser diode known in the industry has a single longitudinal mode response, i.e. it produces coherent light at a single frequency. Examples of this type of component are the Sharp LT022, and the Mitsubishi ML2701, as well as many others known to those skilled in the art. These devices have a spectrum and signal-to-noise characteristics at various power output levels as shown by the curves in FIGS. 3 and 4, respectively. Typically, these devices exhibit a single output frequency as the power supplied to the device is increased. As a result of this characteristic, the single mode laser diodes are more susceptible to light reflected back into the cavity at higher optical output levels, as can be seen in the signal-to-noise curves of FIG. 4. The rise and fall times, i.e. measures of a laser diodes ability to be modulated at high frequencies, are typically very short and in the range of 200-300 picoseconds.

Some manufacturers of laser diodes include "dithering" electronics in the design of the laser diode so that the single mode optical response is broken-up into a series of separate modes. An example of this type of device is the Sharp LT024R10. The inclusion of dithering electronics in the laser diode design adds to the cost and packaging considerations of the device and may not adequately address the overall requirements of a fiber optic data link. For example, a dithering frequency of 300 MHz limits the usable modulation frequency of the laser to frequencies much lower than 300 MHz.

Overall, it is desirable to use single longitudinal mode (single mode) laser diodes because they have optimal beam characteristics and excellent high bandwidth modulation characteristics. On the other hand, single mode laser diodes may present critical problems to multi-mode fiber based communications systems unless the primarily coherent output of the device can be altered so that it behaves more like a self-pulsating laser diode. Thus, it is critical to alter or break-up the coherence of the laser diode optical output to reduce the modal noise associated with single frequency lasers and achieve very high frequency system performance coupled with low bit error rate transmission.

Model noise is an amplitude modulation of the desired optical signal caused by interference effects acting upon the solid-state laser emission. Interference occurs between the various optical modes propagating through an optical fiber, each of the modes being subjected to different delays because of mode dispersion in the fiber. Any change in the output wavelength of the laser, or of the transmission properties of the fiber will tend to alter the interference pattern within the fiber, and accordingly, the mode structure in the fiber. Consequently, an amplitude modulation is produced in the output signal. In fact, it is known that any bending or mechanical repositioning of the fiber alters the mode structure of the fiber. Further, connectors or fiber optic couplers in series in the fiber optic cable also alter the mode structure. When a single mode laser diode supplies an optical signal into a multi-mode fiber, typically several of the propagating modes of the fiber are illuminated. These modes propagate along the fiber with very nearly the same velocity so that over reasonable distances, when one examines the output of the fiber, a "speckle" pattern may be observed. This speckle pattern contains the expected amount of optical power in the aggregate, but in detail the output appears mottled. If a photodiode is used to detect the light carried by the fiber, the speckle pattern may cause a significant variation in the output of the photodiode or detector. This may result in loss of data integrity over the communications link. Typically, the majority of the signal loss occurs at connection joints or at optical couplers in the middle of a fiber optic line where there is a possibility of creating noise in the optical fiber. This is a result of misalignments of the fibers at the coupling or connector interface. If the cores of the fibers, which are typically 0.002 inches in diameter, are not perfectly aligned the light becomes "unguided" and is lost to the system. Usually, a loss at a fiber connector is not terribly detrimental, but when there is a speckle pattern present (attributable to the single frequency laser diode) at the coupler/connector interface, the amount of loss can become randomly time varying. A time variation in optical signals carried by multi-mode optical fibers is typically not synchronous with any system time constant so it results in noise commonly known as modal noise.

A simplified method and apparatus for a fiber optic transmitter that incorporates a single longitudinal mode laser diode in an optical communications system would simplify and reduce the cost of fiber optic communication links, yet enable increased data throughput rates. An economical technique for obtaining multi-mode output from a single mode laser diode is needed to take advantage of the desirable characteristics of such laser diodes.

SUMMARY OF THE INVENTION

A fiber optic transmitter according to one aspect of the present invention comprises a single longitudinal mode laser diode that produces laser light whose intensity corresponds with excitation signals supplied to the diode, first circuit means for supplying a DC offset signal to the diode, second circuit means for supplying a modulated signal to the diode, the modulated signal including modulation corresponding to digital data supplied to a data input of the second circuit means, and third circuit means for producing a high frequency noise signal including all frequencies and supplying the high frequency noise signal to the diode, wherein the noise signal includes frequencies at least as high as the resonant frequency of the laser diode.

A method for exciting a single longitudinal mode semiconductor laser diode to produce multiple longitudinal mode light, according to another aspect of the present invention, comprises the steps of providing a single mode laser diode having a resonant frequency above the modulation frequency of the data, supplying a bias excitation signal to the laser diode, supplying a data signal to the laser diode, supplying a noise signal to the laser diode wherein the noise signal includes frequency components in sufficient amplitude in the bandwidth of the resonant frequency to stimulate the laser diode to produce a multi-mode light output signal.

One object of the present invention is to provide an improved method and device for transmitting optical signals through a multi-mode fiber.

Another object of the present invention is to utilize a single longitudinal mode laser diode in a very high frequency serial bit fiber optic communications system.

Yet another object of the present invention is to provide a fiber optic communications system with high modulation bandwidth thereby providing a fiber optic transmitter with desirable specifications at reduced cost.

Still another object of the present invention is to economically stimulate a single mode laser diode to produce a multi-mode optical output thereby reducing the effects of modal noise in a fiber optic data communications system.

These and other objects of the present invention will become more apparent from the following description of the preferred embodiment.

DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 5:
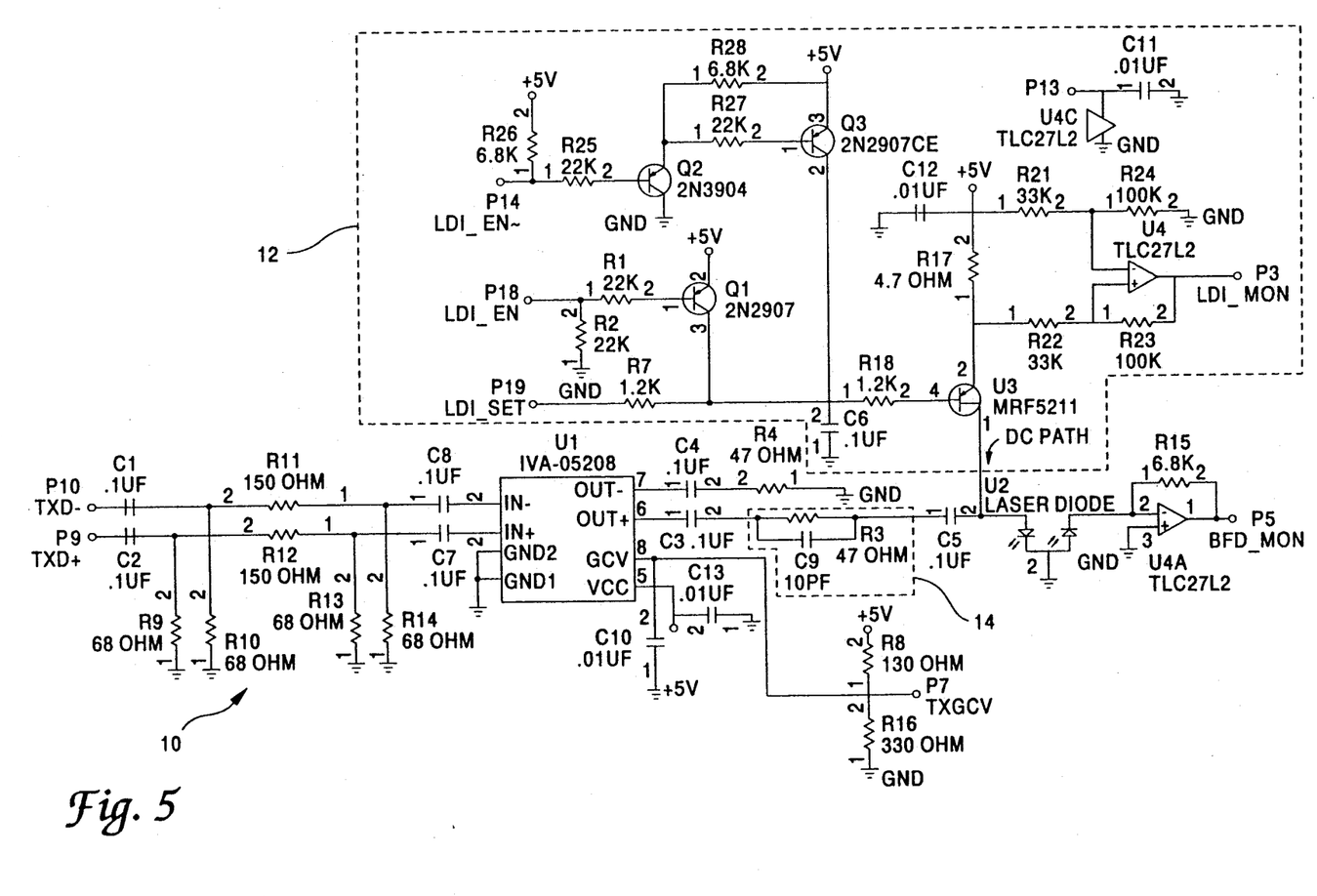
FIG. 5 is a schematic diagram of a fiber optic transmitter circuit according to the present invention for producing multi-mode light from a single longitudinal mode laser diode.

Referring now to FIG. 5., a schematic diagram of the fiber optic transmitter circuit 10 according to the present invention is shown. The circuit 10 consists of a DC bias circuit 12 for providing a DC bias or offset voltage to the laser diode U2, and a buffer/amplifier device U1 for receiving data signals at the input terminals labeled TXD− and TXD+ and supplying a modulation signal to PIN 1 of the laser diode U2 in accordance with the logic levels supplied to the transmitter inputs TXD− and TXD+. Blocking capacitors C1, C2, C3, C4, C7 and C8 provide decoupling in the input and output signal paths associated with amplifier U1. An analog voltage supplied to the connection labeled LDI_SET controls the DC bias signal supplied by transistor Q3 to the laser diode U2. Transistor Q1 can be activated to increase the voltage at the base of transistor U3 thereby forcing the DC voltage supplied by transistor U3 to laser diode U2 to approximately 0 volts. Alternatively, activation of transistors Q2 and Q3 accomplishes the same result. Operational amplifier (op amp) U4B and associated resistors R17 and R21-R24 provide a feedback voltage signal at connection P3 (labeled LD1_MON) corresponding to DC current flowing into diode U2. Op amp U4A produces a feedback voltage at connection P5 corresponding to the optical intensity of the laser diode U2 as detected by the integral photodiode (located between PIN 2 and PIN 3) of laser diode U2.

Operationally speaking, digital data is supplied to the TXD— and TXD+ inputs (differential inputs) and resistors R9–R14 attenuate the input signals below those specified in standard specifications for fiber optic transmitter devices. The output of amplifier U1 stimulates laser diode U2. Attenuation of the input signal is necessary in order to operate amplifier device U1 at a sufficiently high gain setting to produce sufficient noise in the output signal supplied through capacitors C3, peaking circuit 14 and capacitor C5 and subsequently to laser diode U2. The signal supplied to pin 8 of amplifier U1 is a DC voltage defined by a resistor divider that determines the overall gain of the amplifier U1. When amplifier U1 is operated at a high enough gain level, the noise figure or noise level of the device will result in increased broadband noise introduced into the output signal. Amplifier U1 is preferably a 1.5 GHz variable gain amplifier model No. IVA-05208 available from AVANTEK, Inc. 3175 Bowers Ave., Santa Clara, Calif. The AVANTEK amplifier is specified to have a 50 ohm noise figure at a frequency of 0.5 GHz of 9 dB. Typically, the AVANTEK device is used as an amplifier in a communication receiver circuit as a post amplifier or output amplifier.

Figure 6:
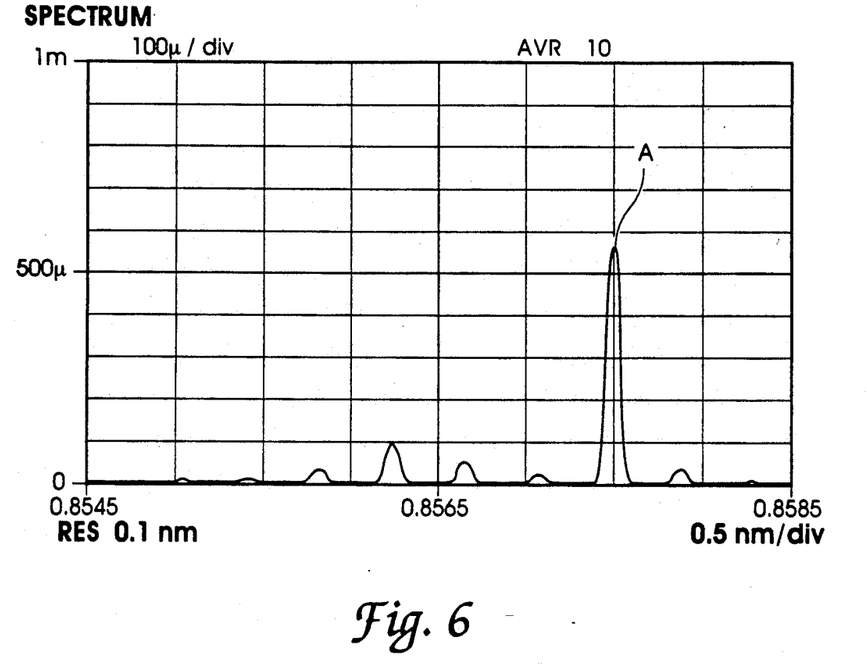
FIG. 6 is a chart depicting the optical spectrum of a laser diode used in the preferred embodiment of FIG. 5 with a modulator signal having a bandwidth greater than the resonant peak of the laser diode.
Figure 7:
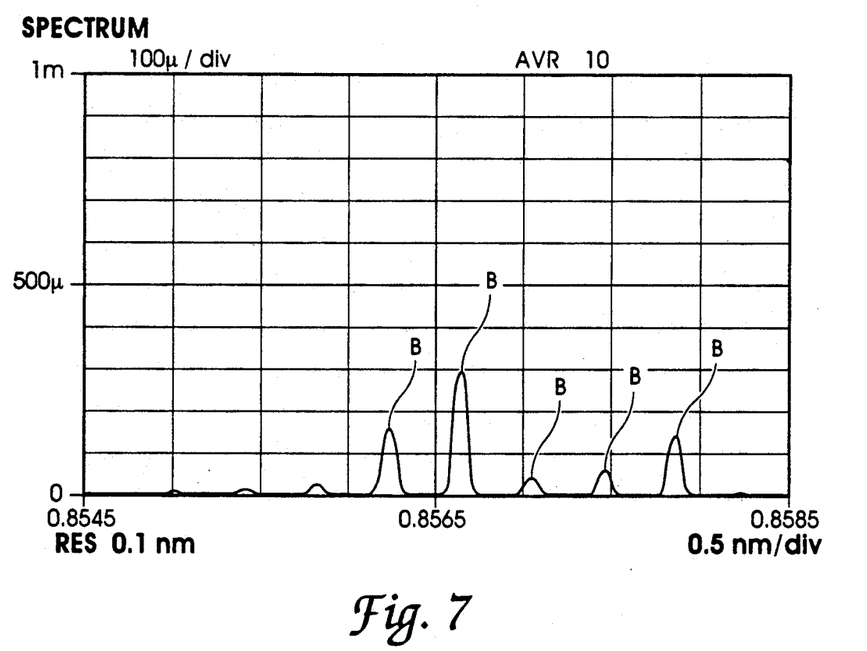
FIG. 7 is a chart depicting the optical spectrum of a single mode laser diode used in the preferred embodiment excited by the modulation signal produced in the circuit of FIG. 5 with higher power in the frequency range of the resonant frequency of the laser diode.
Figure 8:
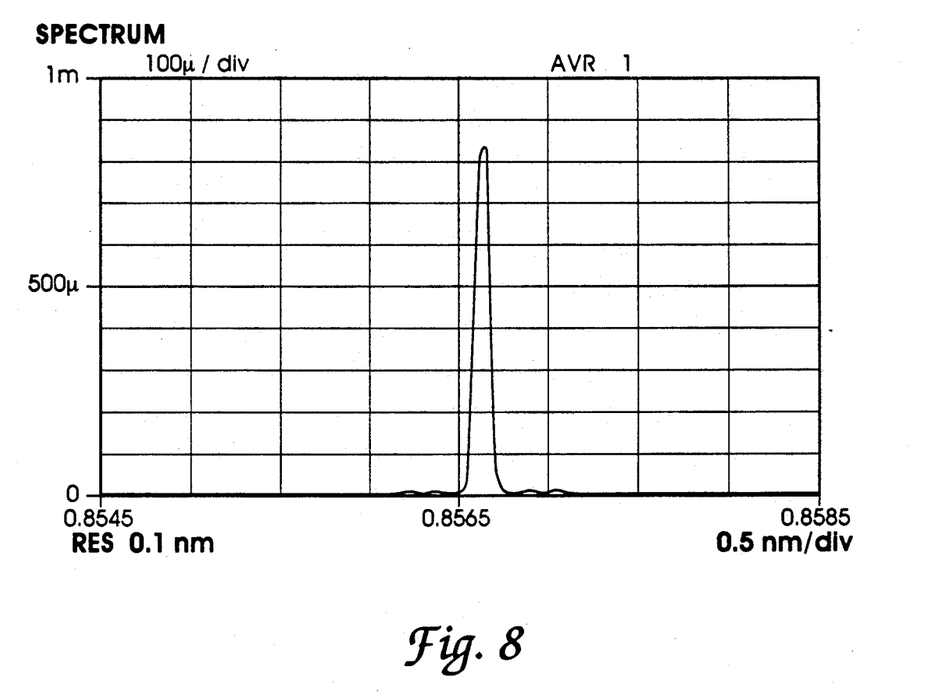
FIG. 8 is a chart depicting the optical spectrum of a single mode laser diode used in the preferred embodiment that is excited by a signal having no frequency components in the resonant frequency range of the laser diode.

The intrinsic noise generating features of the amplifier U1 in conjunction with the peaking circuit 14, consisting of a RC high pass filter, results in an output spectrum from laser diode U2 as shown in FIG. 7. Without the peaking circuit 14, the output of the laser diode U2 is represented by the curve shown in FIG. 6. In either FIG. 6 or FIG. 7, it is apparent that multi-mode output is created from a single mode device. The signal appearing at the output of amplifier U1 includes two important characteristics: first, a signal which has fast rise and fall times and flat voltages either at its low or high output level, and second, a noise component which is generally broadband and includes a significant power component at frequencies up to 2 GHz. The breakup of the single mode laser diode output frequency into multiple frequency spectra enables a fiber optics transmitter 10, modulated in a known fashion, to be significantly less susceptible to various sources of modal noise. Of significant note is that the curve of FIG. 6 reveals that over 50% of the power is still found in one of the modes (labeled A), i.e. the highest peak shown. Further improvement is achieved as shown in the curve in FIG. 7 wherein the distribution of light into a series of longitudinal modes (labeled B) is evident. The modes of FIG. 7 all have relatively similar power levels. For purposes of comparison, FIG. 8 depicts the measured response of a single mode laser diode excited by a low frequency or DC signal.

The higher frequencies that are passed by the peaking circuit 14 provide broadband stimulation of the laser diode's electron-photon resonance. Data rates for data transmitted over a fiber optic link coupled to the optical output of laser diode U2 are between 50 and 750 MHz. This frequency band is substantially below the resonant frequency of the laser diode U2. On the other hand, the noise spectrum of the AVANTEK amplifier is flat from DC to approximately 2 GHz.

The peaking capacitor creates a circuit which has an impedance that varies according to the following table.

TABLE 1

| Frequency | Impedance |
|---|---|
| 1.00 E + 05 | 49.98 |
| 1.00 E + 06 | 49.84 |
| 1.00 E + 07 | 48.48 |
| 1.00 E + 08 | 38.05 |
| 2.00 E + 08 | 30.71 |
| 5.00 E + 08 | 19.45 |
| 1.00 E + 09 | 12.07 |
| 2.00 E + 09 | 6.87 |

In other words, for frequencies typical of the transmitted data information, the impedance is between 20 and 50 ohms, while the impedance in the frequency band of 1.2 GHz is lowered to approximately 10 ohms. Thus, the laser diode is further stimulated by the noise signals in the region wherein the resonant frequency of the laser diode is expected to be found.

Normally, it is desirable to eliminate or minimize all sources of noise in a communications system in order that the data link may have as great a flux budget as possible. Larger flux budgets enable longer fiber lengths to be traversed, enabling additional connectors to be present in series in a fiber optic system. However, high speed data links over multi-mode fiber are normally limited in their application and distance by the bandwidth of the fiber employed. Typically, this distance is less than 2 km. In the preferred embodiment of the circuit of FIG. 10, the maximum distance for a 1 GB/s link is 1 km. At this distance, the fiber attenuation is typically less than 4.0 dB and in-line connectors typically account for another 3-4 dB loss.

A particularly interesting aspect of the circuit 10 is that the noise power fed to the laser diode U2 by the modulation amplifier U1 is enhanced by the peaking capacitor in the frequency band where a single mode laser diode (such as diode U2) typically exhibits natural resonance. To be more specific, single mode laser diodes exhibit a rather flat stimulus versus output spectral response from DC to approximately 1 GHz, but then fall off rather sharply in output up to 10 dB between 1 GHz to 1.5 GHz. However, the optical response rises at the resonant peak to a level substantially the same as the low frequency response. Subsequently, above and below the resonant frequency the output level falls off sharply. The resonant frequency of a typical single mode laser diode is not a critical or controlled parameter during manufacture thereof. Many of the known single mode laser diodes exhibit such a peak in the frequency range from 1.2 to 2.0 GHz. The resonant peak is also known to change with the DC current carried by the laser as well as with operating temperature and other physical characteristics. Therefore, even if a single frequency dithering source for the laser diode is supplied, there is no guarantee that the dithering frequency will accurately track the resonant frequency of the laser diode as operating conditions vary.

Receiver noise and other forms of noise limit the useful flux budget of a typical fiber optic link to approximately 12 dB. By careful filtering of the signal received at the receiver, it has been demonstrated that flux budgets of more than 15 dB are achieved with the circuit 10 in FIG. 5. Additionally, it has been noted that a photodiode (not shown) with a large active area includes natural capacitance that acts as a low pass filter to eliminate the noise introduced into the system as a result of the noise level of amplifier U1.

It should be noted that the noise level or noise factor of a semiconductor device is typically specified at a particular input frequency and is the ratio of the total noise power per unit bandwidth at a corresponding output frequency available at the output when the noise temperature of the input termination is standard at all frequencies. Noise is also typically referred to as unwanted disturbances which are superimposed upon a useful signal, and which tend to obscure its information content. Random noise is the part of noise that is unpredictable, except in a statistical sense. Noise level is also commonly known as the noise power density spectrum in the frequency range of interest, or the average noise power in the frequency range of interest.

Useful applications of the present invention are well known to those skilled in the art. One example of a system to control the circuit 10 is discussed in U.S. Pat. No. 5,019,769 to Levinson, the contents of which are incorporated herein by reference as one example of a fiber optic transmitter/receiver system.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A fiber optic transmitter comprising:
   a single longitudinal mode laser diode that produces laser light whose intensity corresponds with excitation signals supplied to said diode;
   first circuit means for supplying a DC offset signal to said diode;
   second circuit means for supplying a modulated signal to said diode, said modulated signal including modulation corresponding to digital data supplied to a data input of said second circuit means; and
   third circuit means for producing a high frequency noise signal including all frequencies and supplying said high frequency noise signal to said diode, wherein said noise signal includes frequencies at least as high as the resonant frequency of said laser diode.

2. The device of claim 1 wherein said second circuit means and said third circuit means are components of a broadband amplifier having a noise figure in excess of a predetermined level.

3. The device of claim 2 including a high pass filter connected between said amplifier and said laser diode, and wherein said high pass filter attenuates frequencies below the resonant frequency of said laser diode.

4. The device of claim 3 wherein said high pass filter is comprised of a resistor and a capacitor connected in parallel arrangement.

5. The device of claim 3 wherein said high pass filter has a pass band gain greater than unity.

6. A wideband optical data transmission device comprising:
   coherent light source means for generating a coherent optical output corresponding to a signal supplied to an optical input of said light source means, said light source means having a resonant frequency at which periodic excitation at said resonant frequency produces a substantially brighter optical output than excitation frequencies adjacent above or adjacent below said resonant frequency;
   bias means for supplying a bias signal to said optical input;
   buffer means having a buffer input, said buffer means including amplifier means for amplifying signals supplied to said buffer input to produce an amplified signal, and noise level means for producing a wideband noise signal wherein said noise signal includes frequencies corresponding to said resonant frequency of said coherent light source means, said amplified signal and said wideband noise signal are supplied to said optical input; and
   wherein said wideband noise signal is above a predetermined amplitude to stimulate said coherent light source means to produce multi-mode optical output.

7. The device of claim 6 wherein said coherent light source means is a single longitudinal mode laser diode.

8. The device of claim 7 wherein said buffer means is a broadband amplifier having a noise figure in excess of a predetermined level.

9. The device of claim 8 wherein said bias signal is a DC signal designed to illuminate said laser diode at a predetermined optical output level.

10. The device of claim 9 including a high pass filter connected between said buffer means and said coherent light source.

11. The device of claim 6 including a high pass filter connected between said buffer means and said coherent light source.

12. A method for exciting a single longitudinal mode semiconductor laser diode to produce multiple longitudinal mode light, the method comprising the steps of:
   providing a single mode laser diode having a resonant frequency above the modulation frequency of the data;
   supplying a bias excitation signal to said laser diode;
   supplying a data signal to said laser diode;
   supplying a noise signal to said laser diode wherein said noise signal includes frequency components in sufficient amplitude in the bandwidth of said resonant frequency to stimulate said laser diode to produce a multi-mode light output signal.

* * * * *

UNITED STATES PATENT AND TRADEMARK OFFICE
CERTIFICATE OF CORRECTION

PATENT NO. : 5,247,532
DATED : September 21, 1993
INVENTOR(S) : Frank H. Levinson It is certified that error appears in the above-indentified patent and that said Letters Patent is hereby corrected as shown below:

Column 2, line 45, replace "Model" with --Modal--.

Signed and Sealed this

Twenty-second Day of March, 1994

Attest:

BRUCE LEHMAN

*Attesting Officer*  *Commissioner of Patents and Trademarks*